(12) United States Patent
Kobayashi

(10) Patent No.: US 12,672,588 B2
(45) Date of Patent: Jun. 30, 2026

(54) SEMICONDUCTOR DEVICE AND EQUIPMENT

(71) Applicant: CANON KABUSHIKI KAISHA, Tokyo (JP)

(72) Inventor: Hiroaki Kobayashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 339 days.

(21) Appl. No.: 18/343,590

(22) Filed: Jun. 28, 2023

(65) Prior Publication Data

US 2024/0006389 A1     Jan. 4, 2024

(30) Foreign Application Priority Data

Jun. 30, 2022     (JP) ................................. 2022-106005

(51) Int. Cl.
| | |
|---|---|
| *H01L 25/16* | (2023.01) |
| *H10W 70/66* | (2026.01) |
| *H10W 70/685* | (2026.01) |
| *H10W 74/10* | (2026.01) |
| *H10W 90/00* | (2026.01) |

(52) U.S. Cl.
CPC ......... *H10W 90/00* (2026.01); *H10W 70/662* (2026.01); *H10W 70/685* (2026.01); *H10W 74/117* (2026.01); *H10W 90/725* (2026.01)

(58) Field of Classification Search
CPC ..... H01L 25/16; H01L 24/16; H01L 23/3128; H01L 23/49822; H01L 23/49872; H01L 2924/1205; H01L 2924/13067; H01L 2924/13069; H01L 2924/13091; H01L 2224/16165; H01L 25/0652; H01L 23/49816; H01L 2224/81; H01L 25/50; H01L 23/5386; H01L 25/0657; H10D 86/423; H10D 86/60
USPC ........................................................ 257/678
See application file for complete search history.

(56) References Cited

U.S. PATENT DOCUMENTS

| | | |
|---|---|---|
| 9,287,210 B2 | 3/2016 | Kubota |
| 11,206,367 B1 | 12/2021 | Shim |
| 2011/0309353 A1 | 12/2011 | Kaneko et al. |
| 2012/0298986 A1 | 11/2012 | Inoue et al. |

(Continued)

FOREIGN PATENT DOCUMENTS

| | | |
|---|---|---|
| JP | 2003332440 A | 11/2003 |
| JP | 2012064657 A | 3/2012 |

(Continued)

*Primary Examiner* — Monica D Harrison
(74) *Attorney, Agent, or Firm* — Canon U.S.A., Inc, IP Division

(57) ABSTRACT

Embodiments of the present disclosure provide a technique advantageous to an improvement in performance of a semiconductor device. The semiconductor device includes a first monocrystalline semiconductor layer on which a first semiconductor element is arranged, a second monocrystalline semiconductor layer on which a second semiconductor element is arranged, and a thin film transistor electrically connected to the first semiconductor element without an intervention of another semiconductor element arranged on the first monocrystalline semiconductor layer and electrically connected to the second semiconductor element without an intervention of another semiconductor element arranged on the second monocrystalline semiconductor layer.

25 Claims, 8 Drawing Sheets

(56) References Cited

U.S. PATENT DOCUMENTS

| | | | |
|---|---|---|---|
| 2015/0200157 A1 | 7/2015 | Kubota | |
| 2016/0027811 A1* | 1/2016 | Li | H10D 62/124 |
| | | | 257/43 |
| 2016/0088253 A1 | 3/2016 | Tezuka | |
| 2016/0316159 A1 | 10/2016 | Yoneda | |
| 2021/0111115 A1* | 4/2021 | Morrow | H10D 62/393 |
| 2021/0400214 A1 | 12/2021 | Shim | |

FOREIGN PATENT DOCUMENTS

| | | |
|---|---|---|
| JP | 2012156513 A | 8/2012 |
| JP | 2015029106 A | 2/2015 |
| JP | 2015133366 A | 7/2015 |
| JP | 2021064666 A | 4/2021 |

* cited by examiner

SEMICONDUCTOR DEVICE AND EQUIPMENT

BACKGROUND

Field of the Disclosure

The present disclosure relates to a semiconductor device.

Description of the Related Art

There is a need to selectively execute electrical connection and disconnection between semiconductor chips. Japanese Patent Application Laid-Open No. 2015-133366 discusses a technique using a switch connected to electrodes of first and second semiconductor chips. The switch includes a core part which contracts and expands with temperature change and a heat generation part which heats the core part. But with the technique discussed in Japanese Patent Application Laid-Open No. 2015-133366, it is not possible to sufficiently ensure the control accuracy and the stability of the switch.

SUMMARY

Therefore, some embodiments of the present disclosure are directed to a technique which is advantageous when performance of a semiconductor device is improved by controlling electrical connection between a plurality of semiconductor elements.

According to a first aspect of the present disclosure, a semiconductor device includes a first monocrystalline semiconductor layer on which a first semiconductor element is arranged, a second monocrystalline semiconductor layer on which a second semiconductor element is arranged, and a thin film transistor electrically connected to the first semiconductor element without an intervention of another semiconductor element arranged on the first monocrystalline semiconductor layer and electrically connected to the second semiconductor element without an intervention of another semiconductor element arranged on the second monocrystalline semiconductor layer.

According to a second aspect of the present disclosure, a semiconductor device includes a monocrystalline semiconductor layer on which a semiconductor element is arranged, a wiring structure connected to the semiconductor element, which is arranged on an upper side of the monocrystalline semiconductor layer, a through electrode penetrating through the monocrystalline semiconductor layer, and a thin film transistor arranged on one side of the monocrystalline semiconductor layer, which is opposite to a side the wiring structure is arranged, wherein the semiconductor element and the thin film transistor are electrically connected via the wiring structure and the through electrode.

Further features of various embodiments will become apparent from the following description of exemplary embodiments with reference to the attached drawings.

DESCRIPTION OF THE EMBODIMENTS

Figure 1A:
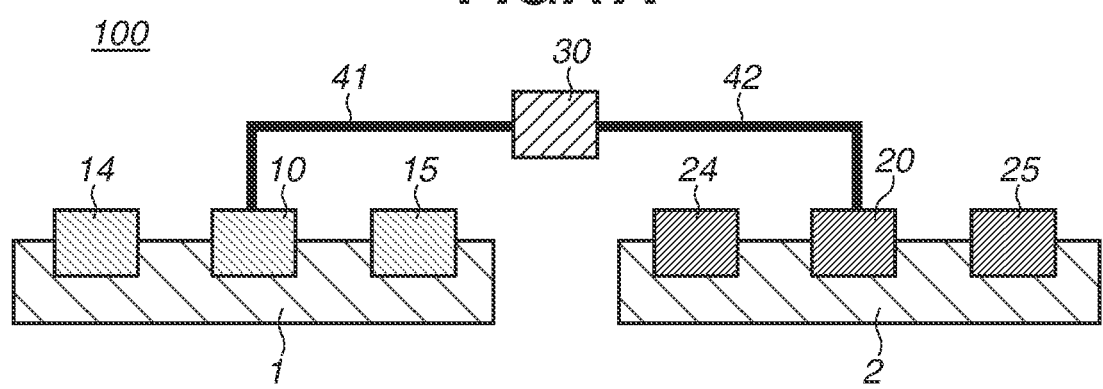
FIGS. 1A to 1C are schematic diagrams illustrating semiconductor devices.

Hereinafter, exemplary embodiments of the present disclosure will be described with reference to the appended drawings. In the below-described exemplary embodiments and drawings, common reference numerals are applied to constituent elements common in a plurality of drawings.

Therefore, the constituent elements common to each other will be described with cross-reference to the plurality of drawings, and descriptions of the constituent elements having the common reference numerals are omitted as appropriate.

Figure 1B:
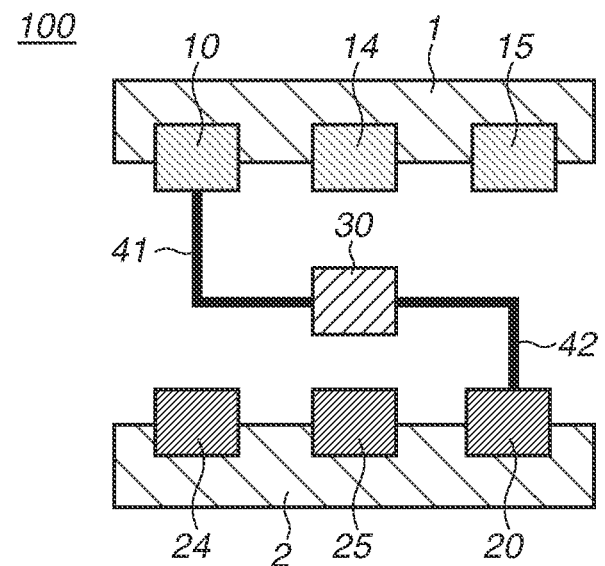

FIG. 1A is a schematic diagram of a 2-dimensional semiconductor device (can also be called "2.5-dimensional semiconductor device") 100, and FIG. 1B is a schematic diagram of a 3-dimensional semiconductor device 100. The 2.5-dimensional semiconductor device 100 is also called "2.5D integrated circuit (2.5D IC)", and the 3-dimensional semiconductor device 100 is also called "3D IC".

First, items common to the 2-dimensional and the 3-dimensional semiconductor devices 100 will be described. The semiconductor device 100 includes a semiconductor layer 1 on which a semiconductor element 10 is arranged, a semiconductor layer 2 on which a semiconductor element 20 is arranged, and a thin film transistor 30 electrically connected to the semiconductor elements 10 and 20. The semiconductor layers 1 and 2 are monocrystalline semiconductor layers. Each of the semiconductor layers 1 and 2 is a discontinuous single crystal. The semiconductor layers 1 and 2 may be the same type or different types. For example, both of the semiconductor layers 1 and 2 may be monocrystalline silicon layers. Alternatively, one of the semiconductor layers 1 and 2 may be a monocrystalline silicon layer whereas the other may be a monocrystalline compound semiconductor layer.

The semiconductor element 10 includes a part of the semiconductor layer 1. The semiconductor element 10 is a diode, a transistor, a thyristor, a resistor, a capacitor, or a quantum well structure. The semiconductor element 20 includes a part of the semiconductor layer 2. The semiconductor element 20 is a diode, a transistor, a thyristor, a resistor, a capacitor, or a quantum well structure. In a case where the semiconductor elements 10 and 20 are diodes, these diodes may be light-emitting diodes or light-receiving diodes (photodiodes). In a case where the semiconductor elements 10 and 20 are photoelectric conversion elements, these photoelectric conversion elements may be avalanche photodiodes. In a case where the semiconductor elements 10 and 20 are transistors, these transistors can typically be metal-oxide semiconductor field-effect transistors (MOSFETs). The MOSFET includes a semiconductor layer having a source and a drain, a gate electrode, a source electrode connected to the source, a drain electrode connected to the drain, and a gate insulation film arranged between the gate electrode and the semiconductor layer. An inversion layer is generated when voltage is applied to a region between a gate electrode and a back-gate of the MOSFET, so that the inversion layer is used as a channel. The MOSFET may be a planar type or a non-planar type, such as a fin field-effect transistor (FinFET).

Each of the semiconductor elements 10 and 20 may be a bipolar transistor. A plurality of semiconductor elements 14 and 15 may be arranged on the semiconductor layer 1 in addition to the semiconductor element 10, and these semiconductor elements 10, 14, and 15 typically constitute an integrated circuit. A plurality of semiconductor elements 24 and 25 may be arranged on the semiconductor layer 2 in addition to the semiconductor element 20, and these semiconductor elements 20, 24, and 25 typically constitute an integrated circuit.

Figure 1C:
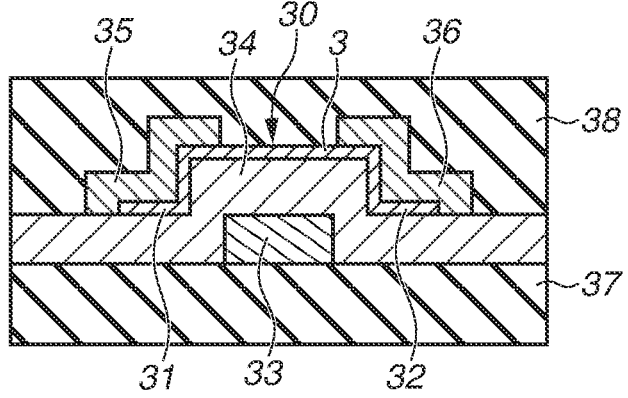

The thin film transistor 30 can also be called "thin film transistor (TFT)". FIG. 1C illustrates a cross-sectional view of one example of the thin film transistor 30. The thin film transistor 30 includes a semiconductor layer 3 including a source/drain 31 and a source/drain 32, a gate electrode 33, and a gate insulation film 34 arranged between the gate electrode 33 and the semiconductor layer 3. The thin film transistor 30 further includes a source/drain electrode 35 which is in contact with the source/drain 31 and a source/drain electrode 36 which is in contact with the source/drain 32. The gate electrode 33 and the source/drain electrodes 35 and 36 are made of conductive materials, such as metal. The thin film transistor 30 is located between interlayer insulation films 37 and 38. A wiring layer (not illustrated) is connected to the source/drain electrodes 35 and 36 through via holes formed in the interlayer insulation film 38. Further, the interlayer insulation films 37 and 38 as well as the below-described interlayer insulation films are not limited to single layer film, and may be multi-layer films including diffusion prevention layers, antireflection layers, etching stop layers, cap layers, and passivation layers.

The semiconductor layer 3 included in the thin film transistor 30 is neither the semiconductor layer 1 made of a monocrystalline semiconductor layer nor the semiconductor layer 2 made of a monocrystalline semiconductor layer. Typically, the semiconductor layer 3 included in the thin film transistor 30 is at least any one of a non-crystalline semiconductor layer and a polycrystalline semiconductor layer. The semiconductor layer 3 included in the thin film transistor 30 has a single layer structure or a multi-layer structure of a non-crystalline semiconductor layer, a single layer structure or a multi-layer structure of a polycrystalline semiconductor layer, or a multi-layer structure including a non-crystalline semiconductor layer and a polycrystalline semiconductor layer. In addition, a semiconductor layer which contains a plurality of microcrystals, and the structure having non-crystalline regions lying between the plurality of microcrystals is also one type of non-crystalline semiconductor layer. In a case where the semiconductor layer 3 has a multi-layer structure, compositions of the semiconductor layers may be different from each other. A semiconductor material of the semiconductor layer 3 may be a group-IV semiconductor, such as polysilicon or amorphous silicon, or may be a II-VI compound semiconductor, such as zinc selenide (Zn—Se), cadmium sulfide (Cd—S), cadmium selenide (Cd—Se), or zinc oxide (Zn—O). A semiconductor material of the semiconductor layer 3 may be an organic semiconductor. In some embodiments, the semiconductor material of the semiconductor layer 3 is an oxide semiconductor, e.g., indium gallium oxide (In—Ga—O), indium gallium zinc oxide (In—Ga—Zn—O), indium tin zinc oxide (In—Sn—Zn—O), or indium gallium zinc tin oxide (In—Ga—Zn—Sn—O). When compared with the polysilicon or the amorphous silicon, the oxide semiconductor can remarkably reduce the OFF current. Therefore, the leak current can be lowered when the oxide semiconductor is used as a switch. On the other hand, electron mobility of the polysilicon is higher than that of the oxide semiconductor or the amorphous silicon. Therefore, the polysilicon has an advantage of being able to increase the driving current. Further, a thin film transistor (TFT) having characteristics of both of a p-type transistor and an n-type transistor can be manufactured from the polysilicon or the amorphous silicon. The semiconductor material of the semiconductor layer 3 can be selected depending on the characteristic of the semiconductor device 100. The semiconductor layer 3 made of the oxide semiconductor can be called "oxide semiconductor layer". Similarly, the respective semiconductor layers 3 made of the other semiconductor materials can be called "group-IV semiconductor layer", "polysilicon layer", and "organic semiconductor layer".

Different from the MOSFET, the TFT generates an accumulation layer in the semiconductor layer 3 when voltage is applied to the gate electrode 33, so that the accumulation layer is used as a channel. As described above, because an operating principle of the TFT is different from that of the MOSFET, the TFT is distinguished from the MOSFET. The MOSFET simply having a thin semiconductor layer is not the TFT. The MOSFET is a four-terminal element having a gate, a back-gate, a source, and a drain, whereas the TFT is a three-terminal element having a gate, a source, and a drain. Although a double-gate can be used for the TFT, the TFT using the double-gate can also be called a three-terminal element because the double-gate uses two gate electrodes actually having the same potential.

The thin film transistor 30 illustrated in FIG. 1C is a bottom-gate type thin film transistor in which a gate electrode 33 and a gate insulation film 34 are formed on a base material on which film deposition of the semiconductor layer 3 is to be executed. However, the thin film transistor 30 may be a top-gate type thin film transistor in which the gate insulation film 34 and the gate electrode 33 are formed on the semiconductor layer 3 after film deposition of the semiconductor layer 3 is executed. Further, the thin film transistor 30 illustrated in FIG. 1C is a staggered type thin film transistor in which the source/drain electrodes 35 and 36 are arranged on one side opposite to another side where the gate electrode 33 is arranged, with the semiconductor layer 3 therebetween. However, the thin film transistor 30 may be a coplanar type thin film transistor in which the source/drain electrodes 35 and 36 are arranged on a side that is the same as a side of the semiconductor layer 3 where the gate electrode 33 is arranged.

The thin film transistor 30 is electrically connected to the semiconductor element 10 via an electric pathway 41. The other semiconductor elements arranged on the semiconductor layer 1 are not included in the electric pathway 41. Therefore, the thin film transistor 30 is electrically connected to the semiconductor element 10 without an intervention of the other semiconductor elements arranged on the semiconductor layer 1. That is, the other semiconductor elements arranged on the semiconductor layer 1 do not intervene on the electric pathway 41 between the thin film transistor 30 and the semiconductor element 10. In other words, the semiconductor element 10 is a semiconductor element arranged on the semiconductor layer 1 to which the thin film transistor 30 is firstly connected when the electric pathway 41 is followed from a side of the thin film transistor 30. The semiconductor element 10 can be connected to the other semiconductor elements 14 and 15 arranged on the semiconductor layer 1.

A semiconductor element other than the semiconductor elements arranged on the semiconductor layer 1 may be included in the electric pathway 41. For example, a thin film transistor may be included in the electric pathway 41. Further, a current pathway does not always have to continue from the thin film transistor 30 to the semiconductor element 10 in the electric pathway 41, and a capacitor may be included in the electric pathway 41.

The thin film transistor 30 is electrically connected to the semiconductor element 20 via an electric pathway 42. The other semiconductor elements arranged on the semiconductor layer 2 are not included in the electric pathway 42. Therefore, the thin film transistor 30 is electrically connected to the semiconductor element 20 without an intervention of the other semiconductor elements arranged on the semiconductor layer 2. That is, the other semiconductor elements arranged on the semiconductor layer 2 do not intervene on the electric pathway 42 between the thin film transistor 30 and the semiconductor element 20. In other words, the semiconductor element 20 is a semiconductor element arranged on the semiconductor layer 2 to which the thin film transistor 30 is firstly connected when the electric pathway 42 is followed from a side of the thin film transistor 30. The semiconductor element 20 can be connected to the other semiconductor elements 24 and 25 arranged on the semiconductor layer 2. A semiconductor element other than the semiconductor elements arranged on the semiconductor layer 2 may be included in the electric pathway 42. For example, a thin film transistor may be included in the electric pathway 42. Further, a current pathway does not always have to continue from the thin film transistor 30 to the semiconductor element 20 in the electric pathway 42, and a capacitor may be included in the electric pathway 42.

Locational freedom of the TFT is higher than that of a semiconductor element including the monocrystalline semiconductor. For example, although the monocrystalline semiconductor layer is necessary for the MOSFET, the TFT can easily be formed when a non-crystalline semiconductor layer and/or a polycrystalline semiconductor layer can be made by film deposition. Further, an on/off threshold value and an amplification factor can easily be controlled by controlling the characteristics of the TFT. Furthermore, the TFT requires only three wirings because the TFT is a three-terminal element. Therefore, it is possible to provide a less complex semiconductor device 100. Accordingly, connecting the semiconductor elements 10 and 20 with the thin film transistor 30 is advantageous to the improvement in performance of the semiconductor device 100.

The semiconductor layers 1 and 2 of the 2-dimensional semiconductor device 100 illustrated in FIG. 1A are not stacked on each other. For example, the semiconductor layers 1 and 2 can be juxtaposed with each other. The semiconductor layers 1 and 2 of the 2-dimensional semiconductor device 100 illustrated in FIG. 1B are stacked on each other. In the example illustrated in FIG. 1B, the thin film transistor 30 is arranged between the semiconductor layers 1 and 2 stacked on each other. However, the thin film transistor may be arranged on a side, which is opposite to a side the semiconductor layer 2 is located, of the semiconductor layer 1 stacked on the semiconductor layer 2, or may be arranged on a side, which is opposite to a side the semiconductor layer 1 is located, of the semiconductor layer 2 stacked on the semiconductor layer 1.

Figure 2A:
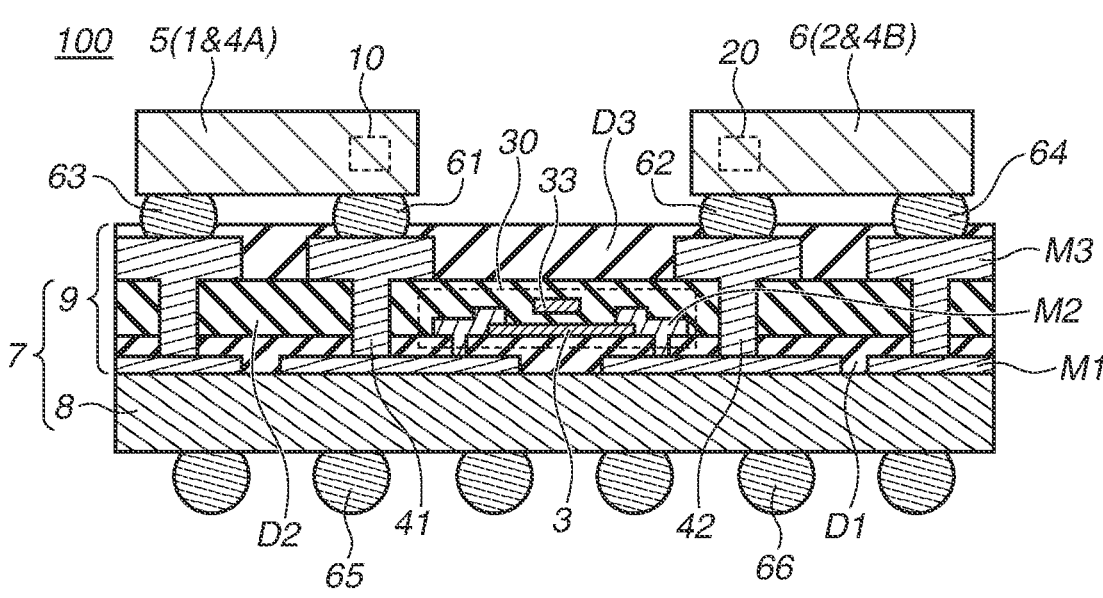
FIGS. 2A to 2B are schematic diagrams illustrating semiconductor devices.

FIG. 2A is a diagram illustrating an example of a 2-dimensional (or 2.5-dimensional) semiconductor device 100 according to a first exemplary embodiment. The semiconductor device 100 includes a semiconductor chip 5, a semiconductor chip 6, and a circuit board 7 on which the semiconductor chips 5 and 6 are mounted. The semiconductor chip 5 includes a semiconductor layer 1 on which a semiconductor element 10 is arranged and a wiring structure 4A arranged on the upper side of the semiconductor layer 1, although detailed description thereof is omitted. The semiconductor chip 6 includes a semiconductor layer 2 on which a semiconductor element 20 is arranged and a wiring structure 4B arranged on the upper side of the semiconductor layer 2, although detailed description thereof is omitted. Each of the semiconductor chips 5 and 6 can also be called "chiplet". The circuit board 7 includes a substrate 8 and a wiring structure 9 arranged on the upper side of the substrate 8. The substrate 8 can be a resinous substrate such as a glass epoxy substrate, a semiconductor substrate such as a silicon substrate, or a glass substrate. The wiring structure 9 includes a plurality of wiring layers M1, M2, and M3, and a plurality of interlayer insulation films D1, D2, and D3 in the peripheries of the wiring layers M1, M2, and M3. The semiconductor chip 5 and the circuit board 7 are connected to each other via bumps 61 and 63, and the semiconductor chip 6 and the circuit board 7 are connected to each other via bumps 62 and 64. Bumps 65 and 66 are arranged on one side of the circuit board 7 opposite to the side where the semiconductor chips 5 and 6 are located, and the circuit board 7 is connected to a mother board (not illustrated) via the bumps 65 and 66. Each of the bumps 65 and 66 is connected to the wiring structure 9 by a through electrode (not illustrated) arranged in the substrate 8. The circuit board 7 functions as an interposer. When the circuit board 7 functions as a mother board, the bumps 65 and 66 are not necessary. The wiring layer M1 is covered by the interlayer insulation film D1, and the thin film transistor 30 is arranged on the upper side of the interlayer insulation film D1. Wiring of the wiring layer M2 is connected to the thin film transistor 30, and this wiring is connected to the wiring layer M1 through a via hole formed in the interlayer insulation film D1. Each of the source/drain electrodes 35 and 36 included in the thin film transistor 30 are made of the wiring layer M2. The thin film transistor 30 is covered by an interlayer insulation film D2, and the interlayer insulation film D2 is covered by an interlayer insulation film D3. Wiring of wiring layer M3 is connected to the wiring layer M1 through via holes formed in the interlayer insulation films D1 and D2. In order to ensure stable operation of the thin film transistor 30, the interlayer insulation films D1 and D2 located on the upper side and the lower side of the thin film transistor 30 can be inorganic insulation films, such as oxide silicon films or nitride silicon films. The interlayer insulation film D3 may be an inorganic insulation film or an organic insulation film, such as a solder mask. By using the solder mask as the interlayer insulation film D3, the semiconductor chips 5 and 6 can easily be bonded thereon by the bumps 61 to 64. The electric pathway 41 is made of the wiring layers M2, M1, and M3 and of the bump 61, and the electric pathway 42 is made of the wiring layers M2, M1, and M3 and of the bump 62. The bump 63 connected to the semiconductor chip 5 and the bump 64 connected to the semiconductor chip 6 may be connected to the other respective semiconductor chips arranged on the circuit board 7, or may be connected to each other or the bumps 65 and 66 via the wiring structure 9.

Figure 2B:
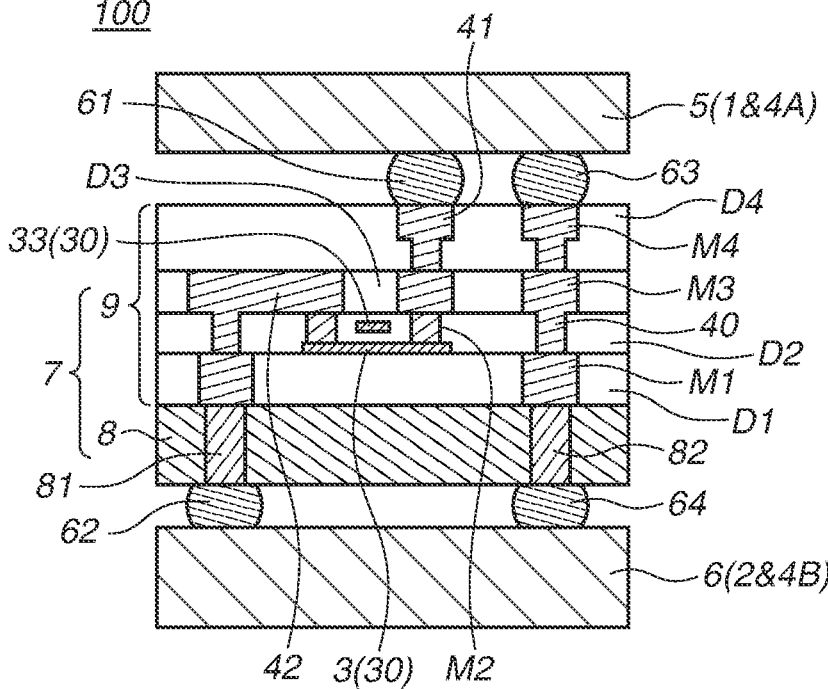

FIG. 2B is a diagram illustrating an example of a 3-dimensional semiconductor device 100 according to a second exemplary embodiment. Descriptions common to those described in the first exemplary embodiment (FIG. 2A) are omitted. In the present exemplary embodiment, semiconductor chips 5 and 6 are respectively arranged on the upper side and the lower side of a circuit board 7. A semiconductor layer 1 included in the semiconductor chip 5 and a semiconductor layer 2 included in the semiconductor chip 6 may overlap with each other in a vertical direction. In a wiring structure 9, a wiring layer M1 is arranged in each of trenches formed in an interlayer insulation film D1, and a thin film transistor 30 is arranged on the upper side of the interlayer insulation film D1. The thin film transistor 30 is covered by an interlayer insulation film D2, and wiring of the wiring layer M2 is connected to the thin film transistor 30 through a via hole formed in the interlayer insulation film D2. The interlayer insulation film D2 is covered by an interlayer insulation film D3, and a wiring layer M3 is arranged in each of trenches formed in the interlayer insulation film D3. The interlayer insulation film D3 is covered by an interlayer insulation film D4, and wiring layers M4 are arranged in trenches formed in the interlayer insulation film D4. The wiring layers M4 are respectively connected to the semiconductor chip 5 via the bumps 61 and 63. Through electrodes 81 and 82 connected to the respective wiring layers M1 are arranged in the substrate 8, and the through electrodes 81 and 82 are respectively connected to the semiconductor chip 6 via the bumps 62 and 64. The wiring layers M2, M3, and M4, and the bump 61 constitute the electric pathway 41 between the semiconductor element 10 and the thin film transistor 30. The wiring layers M2, M3, and M1, the through electrode 81, and the bump 62 constitute the electric pathway 42 between the semiconductor element 20 and the thin film transistor 30. Further, the bump 63, the wiring layers M4, M3, and M1, the through electrode 82, and the bump 64 constitute the electric pathway 40 between the semiconductor chips 5 and 6 without an intervention of the thin film transistor 30. The above-described electric pathway 40 can serve as a communication pathway between the semiconductor chips 5 and 6.

According to the first and second exemplary embodiments, active functions can be provided to the circuit board 7 by arranging the thin film transistor 30 on the upper side of the substrate 8 of the circuit board 7. Therefore, it is advantageous to the improvement in performance of the semiconductor device 100. By overlapping the semiconductor chips 5 and 6 as described in the second exemplary embodiment, a footprint of the semiconductor device 100 can be miniaturized and smaller than that of the first exemplary embodiment.

A connection relationship of the semiconductor element 10, the semiconductor element 20, and the thin film transistor 30 of the semiconductor device 100 is described with reference to several examples. In each of the examples in FIGS. 3A to 3F and FIGS. 4A and 4B, the semiconductor element 10 is a MOSFET including a source/drain 11, a source/drain 12, and a gate electrode 13. One of the source/drain 11 and the source/drain 12 functions as a source whereas the other functions as a drain. Further, the semiconductor element 20 is a MOSFET including a source/drain 21, a source/drain 22, and a gate electrode 23. One of the source/drain 21 and the source/drain 22 functions as a source whereas the other functions as a drain.

Figure 3A:
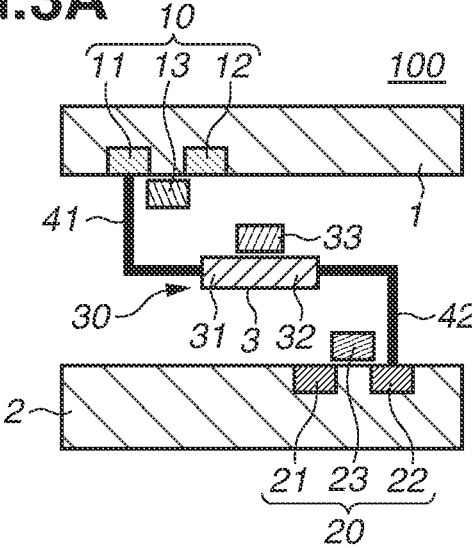
FIGS. 3A to 3F are schematic diagrams illustrating semiconductor devices.

In a first example illustrated in FIG. 3A, the source/drain 31 of the thin film transistor 30 is connected to the source/drain 11 of the semiconductor element 10 via the electric pathway 41. Then, the source/drain 32 of the thin film transistor 30 is connected to the source/drain 22 of the semiconductor element 20 via the electric pathway 42. The thin film transistor 30 can be used as a switch element arranged between the electric pathway 41 and the electric pathway 42.

Figure 3B:
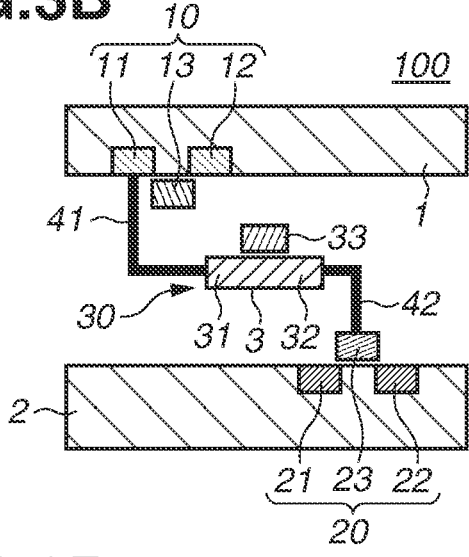

In a second example illustrated in FIG. 3B, the source/drain 31 of the thin film transistor 30 is connected to the source/drain 11 of the semiconductor element 10 via the electric pathway 41. Then, the source/drain 32 of the thin film transistor 30 is connected to the gate electrode 23 of the semiconductor element 20 via the electric pathway 42. The thin film transistor 30 can be used as a switch element arranged between the electric pathway 41 and the electric pathway 42.

Figure 3C:
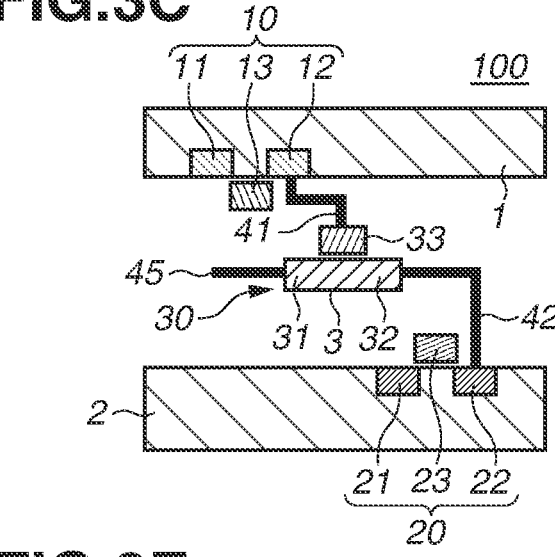

In a third example illustrated in FIG. 3C, the gate electrode 33 of the thin film transistor 30 is connected to the source/drain 12 of the semiconductor element 10 via the electric pathway 41. Then, the source/drain 32 of the thin film transistor 30 is connected to the source/drain 22 of the semiconductor element 20 via the electric pathway 42. The source/drain 31 of the thin film transistor 30 is connected to an appropriate electric pathway 45. The thin film transistor 30 can be used as a switch element arranged between the electric pathway 45 and the electric pathway 42, and the semiconductor element 10 can be used for controlling the thin film transistor 30.

Figure 3D:
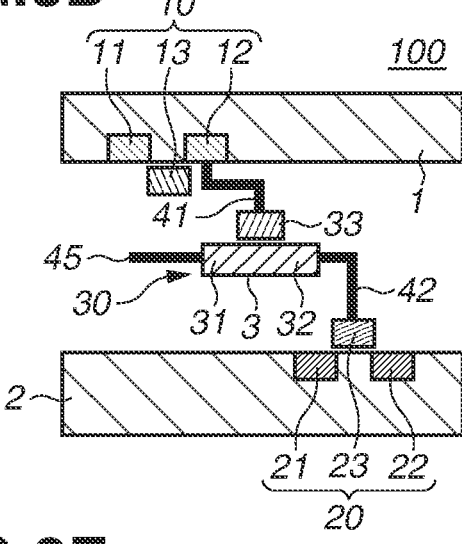

In a fourth example illustrated in FIG. 3D, the gate electrode 33 of the thin film transistor 30 is connected to the source/drain 12 of the semiconductor element 10 via the electric pathway 41. Then, the source/drain 32 of the thin film transistor 30 is connected to the gate electrode 23 of the semiconductor element 20 via the electric pathway 42. The source/drain 31 of the thin film transistor 30 is connected to the appropriate electric pathway 45. The thin film transistor 30 can be used as a switch element arranged between the electric pathway 45 and the electric pathway 42, and the semiconductor element 10 can be used for controlling the thin film transistor 30.

Figure 3E:
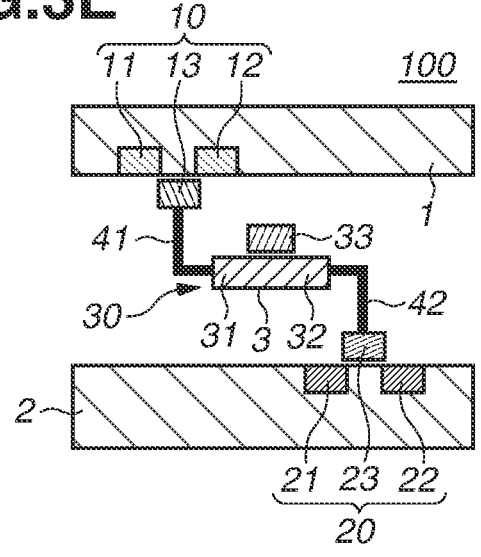

In a fifth example illustrated in FIG. 3E, the source/drain 31 of the thin film transistor 30 is connected to the gate electrode 13 of the semiconductor element 10 via the electric pathway 41. Then, the source/drain 32 of the thin film transistor 30 is connected to the gate electrode 23 of the semiconductor element 20 via the electric pathway 42. For example, when a signal is applied to the electric pathway 41 or 42 in a state where the thin film transistor 30 is ON, the semiconductor elements 10 and 20 can be controlled in the same phase.

Figure 3F:
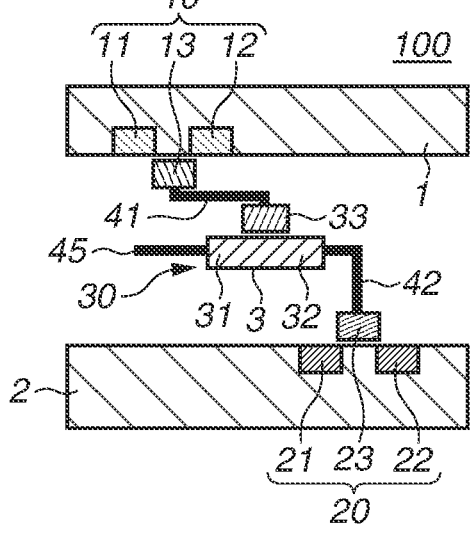

In a sixth example illustrated in FIG. 3F, the gate electrode 33 of the thin film transistor 30 is connected to the gate electrode 13 of the semiconductor element 10 via the electric pathway 41. Then, the source/drain 32 of the thin film transistor 30 is connected to the gate electrode 23 of the semiconductor element 20 via the electric pathway 42. The source/drain 31 of the thin film transistor 30 is connected to the appropriate electric pathway 45. For example, when a signal is applied to the electric pathway 41 in a state where the thin film transistor 30 is ON, the semiconductor element 10 and the thin film transistor 30 can be controlled in the same phase.

In addition, in a case where the semiconductor element 10 is a bipolar transistor, each of the two semiconductor regions described as the source/drain 11 and the source/drain 12 can be read as "emitter/collector". One of the two semiconductor regions provided as an emitter/collector functions as an emitter whereas the other functions as a collector. Further, in a case where the semiconductor element 10 is a diode, each of the source/drain 11 and the source/drain 12 may be read as "cathode/anode". One of the two semiconductor regions provided as a cathode/anode functions as a cathode whereas the other functions as an anode. The same can also be said for the source/drain 21 and the source/drain 22 of the semiconductor element 20.

Figure 4A:
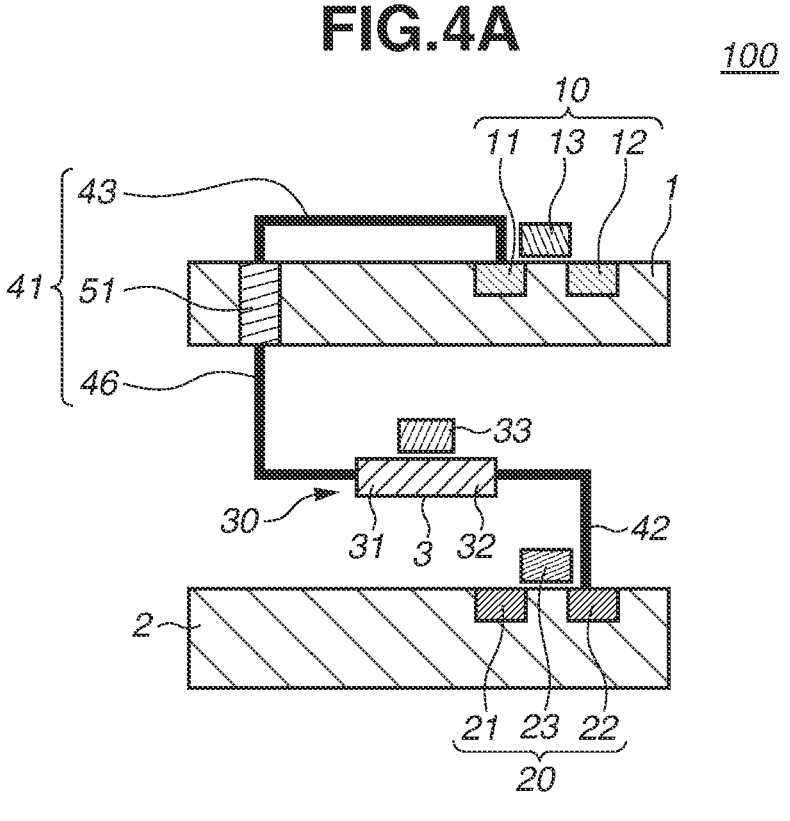
FIGS. 4A to 4B are schematic diagrams illustrating semiconductor devices.

In a seventh example illustrated in FIG. 4A, the thin film transistor 30 is arranged on a side of a back face of the semiconductor layer 1 opposite to a front face on which the semiconductor element 10 is arranged. A through electrode 51 is arranged in the semiconductor layer 1, and the through electrode 51 is connected to the semiconductor element 10 via a wiring pathway 43 arranged on a side of the front face of the semiconductor layer 1. Further, the through electrode 51 is connected to the thin film transistor 30 via a wiring pathway 46 arranged on a side of the back face of the semiconductor layer 1. The electric pathway 41 is made of the through electrode 51, the wiring pathway 43, and the wiring pathway 46. For example, the wiring pathway 46 can constitute power supply wiring, such as a power delivery network (PDN). In this example, the wiring pathway 43 is connected to the source/drain 11. However, the wiring pathway 43 may be connected to the back-gate (well or body). The other points may be similar to those illustrated in the first example in FIG. 3A, or may be changed as illustrated in the second to the sixth examples in FIGS. 3B to 3F.

Figure 4B:
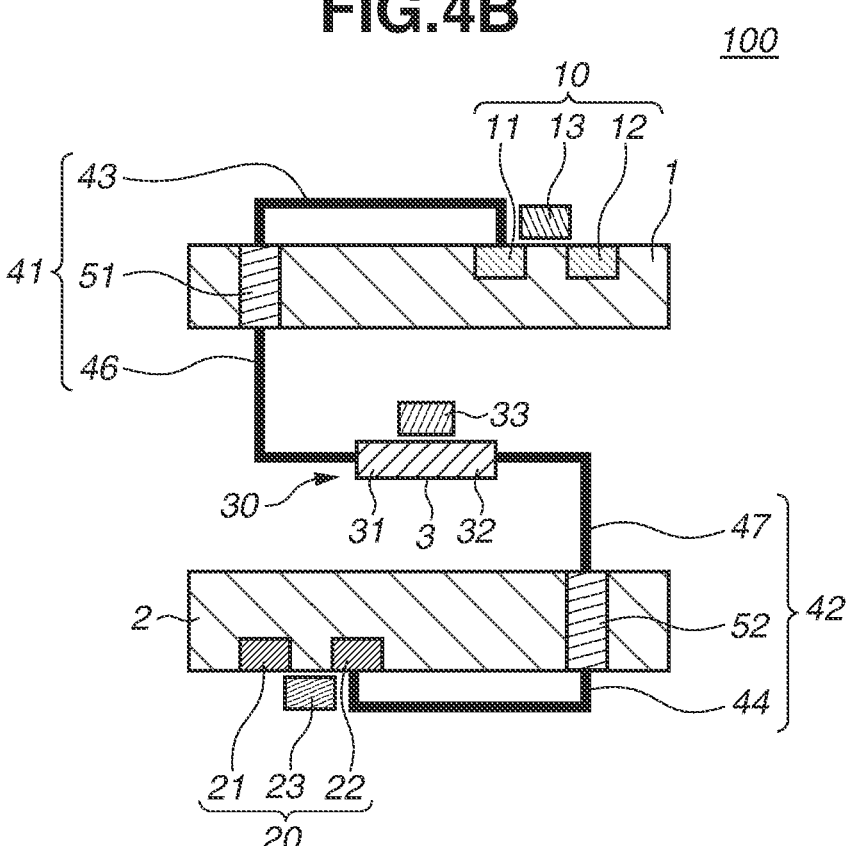

In an eighth example illustrated in FIG. 4B, the thin film transistor 30 is arranged on a side of a back face of the semiconductor layer 2 opposite to a front face on which the semiconductor element 20 is arranged. A through electrode 52 is arranged in the semiconductor layer 2, and the through electrode 52 is connected to the semiconductor element 20 via a wiring pathway 44 arranged on a side of the front face of the semiconductor layer 2. Further, the through electrode 52 is connected to the thin film transistor 30 via a wiring pathway 47 arranged on a side of the back face of the semiconductor layer 2. The electric pathway 42 is made of the through electrode 52, the wiring pathway 44, and the wiring pathway 47. For example, the wiring pathway 47 can constitute power supply wiring, such as a PDN. In this example, the wiring pathway 44 is connected to the source/drain 22. However, the wiring pathway 44 may be connected to the back-gate (well or body). The other points may be similar to those illustrated in the seventh example in FIG. 4A or those of a variation example of the seventh example.

The connection relationship of the semiconductor elements 10 and 20 and the thin film transistor 30 described in each of the first to seventh examples can also be applied to the 3-dimensional semiconductor devices 100 illustrated in FIGS. 1A to 1C and FIGS. 2A and 2B.

In each of the first and second exemplary embodiments, the thin film transistor 30 is arranged inside the circuit board 7, i.e., outside the semiconductor chips 5 and 6. However, the thin film transistor 30 can be built into the semiconductor chip 5 or 6. These exemplary embodiments are described as third to sixth exemplary embodiments.

Figure 5A:
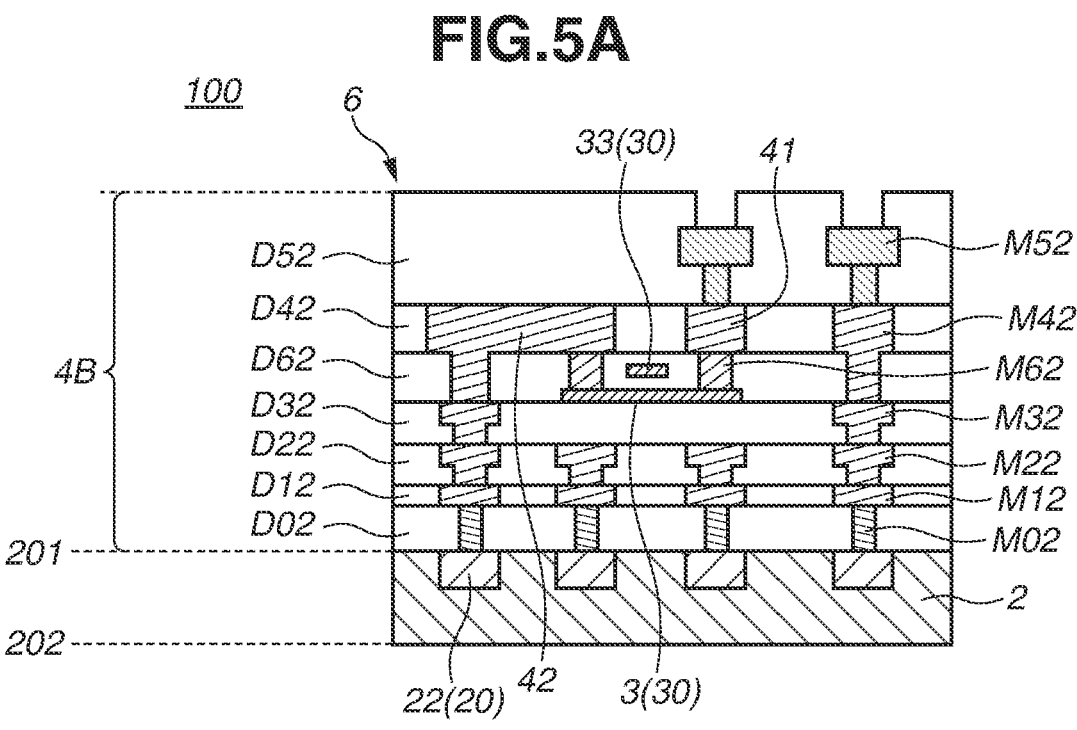
FIGS. 5A to 5B are schematic diagrams illustrating semiconductor devices.

FIG. 5A is a diagram illustrating an example of a main part (semiconductor chip 6) of the semiconductor device 100 including the thin film transistor 30 built into the semiconductor chip 6 according to a third exemplary embodiment. The semiconductor device 100 includes a semiconductor layer 2 and a wiring structure 4B arranged on the upper side of the semiconductor layer 2. The wiring structure 4B includes a plurality of wiring layers M02, M12, M22, M32, M42, M52, and M62, and a plurality of interlayer insulation films D02, D12, D22, D32, D42, D52, and D62 in the peripheries thereof. The wiring layer M02 serving as a contact plug is arranged in each of contact holes formed in the interlayer insulation film D02. The wiring layer M12 having a single damascene structure is arranged in each of trenches formed in the interlayer insulation film D12, and the wiring layers M22, M32, and M42 having a dual damascene structure are respectively arranged in trenches formed in the interlayer insulation films D22, D32, and D52. The wiring layer M52 serving as a pad is arranged on the upper side of the wiring layer M42. A semiconductor layer 3 and a gate electrode 33 of the thin film transistor 30 are arranged on the upper side of the interlayer insulation film D32, and the thin film transistor 30 is covered by the interlayer insulation films D42 and D62. The thin film transistor 30 is arranged among the interlayer insulation film D52, D62, and D32. The wiring layers M22 and M12 are located between the thin film transistor 30 and the semiconductor layer 2. The wiring layers M62 serving as the source/drain electrodes 35 and 36 (see FIG. 1C) are connected to the semiconductor layer 3 of the thin film transistor 30. A source/drain 22 described as a part of the semiconductor element 20 is arranged on a side of a front face 201 of the semiconductor layer 2. The wiring layer M02 serving as a contact plug, which is in contact with the source/drain 22 and the wiring layers M12, M22, M32, and M42 constitute an electric pathway 42. The wiring layers M42 and M52 constitute the electric pathway 41 to the semiconductor element 10 (not illustrated in FIG. 5A). A distance between the front face 201 on which the semiconductor element 20 is arranged and a back face 202 opposite to the front face 201 corresponds to a thickness of the semiconductor layer 2. Although a thickness of the semiconductor layer 2 can be approximately 750 μm, for example, a thickness thereof may be less than 500 μm, 50 μm or less, or 5 μm or less. Further, in some embodiments, a thickness thereof is 0.1 μm or more, and in some embodiments, a thickness thereof is 1 μm or more.

Figure 5B:
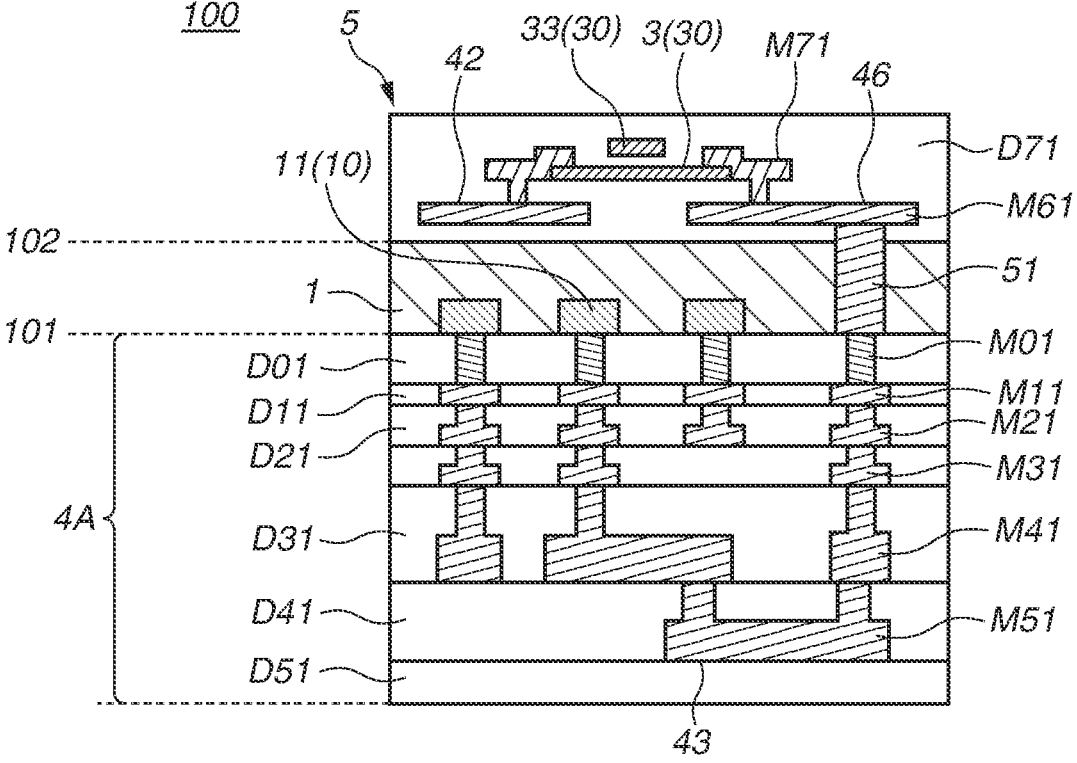

FIG. 5B is a diagram illustrating an example of a main part (semiconductor chip of the semiconductor device 100 including the thin film transistor 30 built into the semiconductor chip 5 according to a fourth exemplary embodiment. The present exemplary embodiment can be applied to the semiconductor chip 5 including the semiconductor layer 1 illustrated in each of the seventh and eighth examples in FIGS. 4A and 4B.

The semiconductor device 100 includes a semiconductor layer 1 and a wiring structure 4A arranged on the upper side of the semiconductor layer 1. The wiring structure 4A includes a plurality of wiring layers M01, M11, M21, M31, M41, and M51, and a plurality of interlayer insulation films D01, D11, D21, D31, D41, and D51 in the peripheries thereof. The wiring layer M01 serving as a contact plug is arranged in each of contact holes formed in the interlayer insulation film D01. The wiring layer M11 having a single damascene structure is arranged in each of trenches formed in the interlayer insulation film D11, and the wiring layers M21, M31, M41, and M51 having the dual damascene structure are respectively arranged in trenches formed in the interlayer insulation films D21, D31, and D41. The interlayer insulation film D51 functions as a protection film (passivation film). A source/drain 11 described as a part of the semiconductor element 10 is arranged on a side of a front face 101 of the semiconductor layer 1. A through electrode 51 penetrating through the semiconductor layer 1 is arranged in the semiconductor chip 5. The thin film transistor 30 is arranged on a side of a back face 102 of the semiconductor layer 1 opposite to a front face 101 on which the semiconductor element 10 is arranged. A wiring layer M61 connected to the through electrode 51 is arranged on the upper side of the back face 102.

The wiring layers M71 serving as the source/drain electrodes 35 and 36 (see FIG. 1C) are connected to the semiconductor layer 3 of the thin film transistor 30. The wiring layers M71 are connected to the wiring layers M61. The thin film transistor 30 is covered by an interlayer insulation film D71. As described above, the thin film transistor 30 is arranged on one side of the semiconductor layer 1, opposite to another side the wiring structure 4A is arranged. The wiring layer M01 serving as a contact plug, which is in contact with the source/drain 11, and the wiring layers M11, M21, M31, M41, and M51 constitute a wiring pathway 43. The wiring layer M61 constitutes a wiring pathway 46. Then, the wiring pathway 43, the through electrode 51, and the wiring pathway 46 constitute the electric pathway 41 illustrated in FIGS. 4A and 4B. The wiring layer M61 constitutes the electric pathway 42 to the semiconductor element 20 (not illustrated in FIG. 5B). A distance between the front face 101 on which the semiconductor element 10 is arranged and the back face 102 opposite to the front face 101 corresponds to a thickness of the semiconductor layer 1. It may be difficult to form the through electrode 51 when a thickness of the semiconductor layer 1 is approximately 750 μm. Therefore, in some embodiments, a thickness of the semiconductor layer 1 is less than 500 μm, is 50 μm or less, or is 5 μm or less. Further, in some embodiments, a thickness thereof is 0.1 μm or more, and in some embodiments, a thickness thereof is 1 μm or more.

According to the semiconductor device 100 described in the present exemplary embodiment, lowering of an integration degree on a side of the front face 101 can be suppressed by arranging the thin film transistor 30 on a side of the back face 102. Reduction of power-supply noise and lowering of power consumption are possible by controlling the power supplied to the integrated circuit of the semiconductor layer 1 via the through electrode 51 by the thin film transistor 30.

Figure 6A:
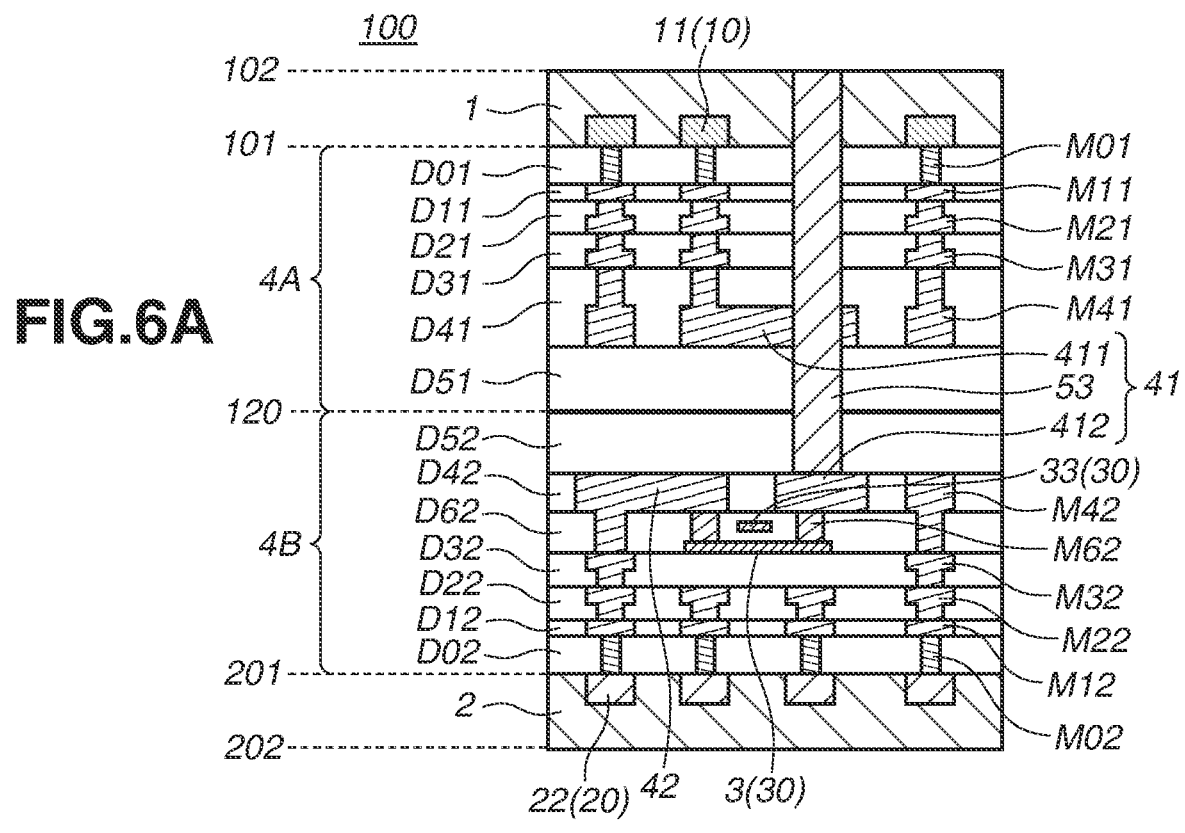
FIGS. 6A to 6B are schematic diagrams illustrating semiconductor devices.
Figure 6B:
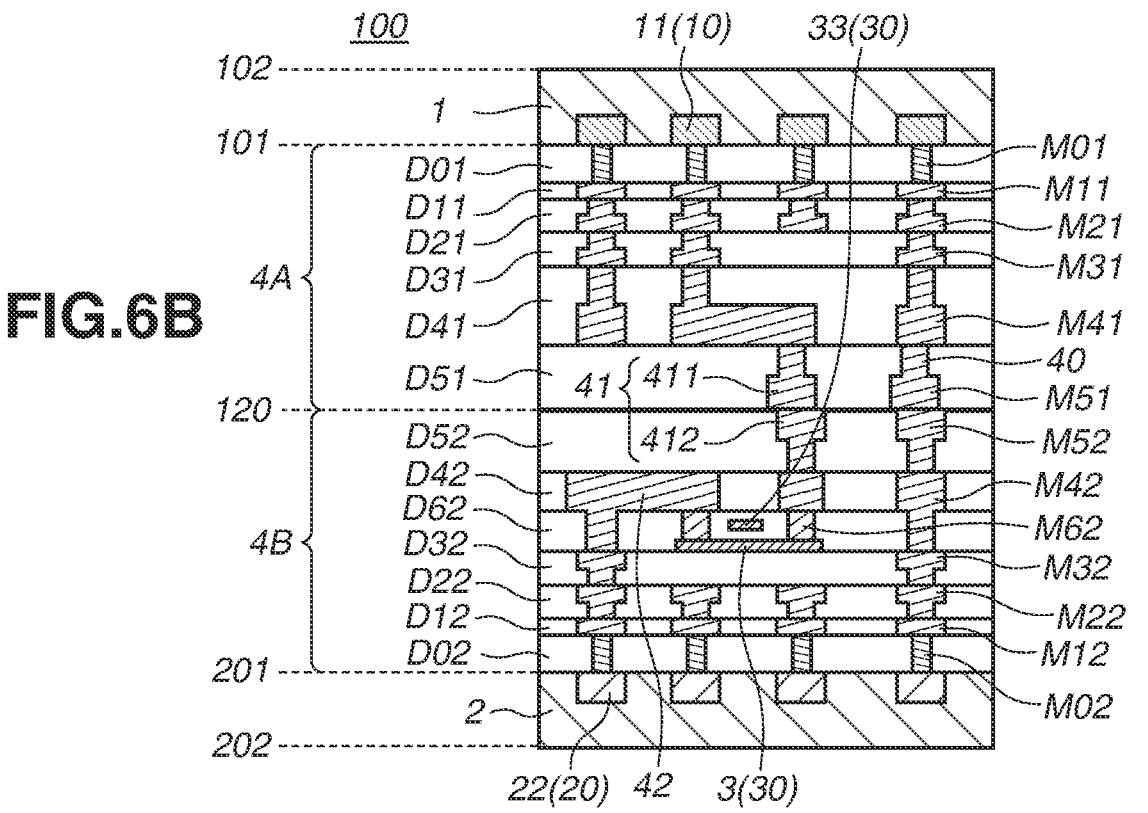

A fifth exemplary embodiment is described with respect to a lamination-type semiconductor device 100 in which a semiconductor chip including a semiconductor layer 1 and a semiconductor chip including a semiconductor layer 2 are stacked on one another (e.g., as shown in FIGS. 6A and 6B). The lamination-type semiconductor device 100 includes the semiconductor layers 1 and 2 stacked on one another. The semiconductor device 100 can be manufactured by bonding wafers to each other and dicing a bonded member consisting of the bonded wafers. Alternatively, the semiconductor device 100 may be manufactured by bonding chips consisting of diced wafers to each other, or may be manufactured by bonding a chip consisting of a diced wafer to a wafer.

A wiring structure 4A is arranged on the upper side of the semiconductor layer 1, and a wiring structure 4B is arranged on the upper side of the semiconductor layer 2. The semiconductor layers 1 and 2 overlap with each other in a state where the wiring structure 4A is located between the semiconductor layer 1 and the semiconductor layer 2 whereas the wiring structure 4B is located between the wiring structure 4A and the semiconductor layer 2. Configurations of wiring layers M01 to M41 of the wiring structure 4A are similar to those illustrated in FIG. 5B. Therefore, descriptions thereof are omitted. Further, configurations of wiring layers M02 to M42 of the wiring structure 4B are similar to those illustrated in FIG. 5A. Therefore, descriptions thereof are omitted.

The wiring structure 4A and the wiring structure 4B are bonded to each other at a bonding face 120. An interlayer insulation film D51 provided as an uppermost layer of the wiring structure 4A is directly bonded to an interlayer insulation film D52 provided as an uppermost layer of the wiring structure 4B through covalent bonding.

The semiconductor device 100 includes a through electrode 53 penetrating through the semiconductor layer 1. The through electrode 53 penetrates through the interlayer insulation films D01 to D51, the interlayer insulation film D52, and the wiring layer M41 to reach the wiring layer M42 of the wiring structure 4B. The through electrode 53 is in contact with the wiring layer M41, and also in contact with the wiring layer M42. With this structure, the wiring layers M41 and M42 are electrically connected to each other via the through electrode 53. An electric pathway 41 that connects the thin film transistor 30 and the semiconductor element 10 is made of a wiring pathway 411 included in the wiring structure 4A, a wiring pathway 412 included in the wiring structure 4B, and the through electrode 53.

A sixth exemplary embodiment is also described with respect to a lamination-type semiconductor device 100 in which a semiconductor chip including a semiconductor layer 1 and a semiconductor chip including a semiconductor layer 2 are stacked on another. The present exemplary embodiment is similar to the fifth exemplary embodiment except for a connection mode of wiring structures 4A and 4B. Therefore, descriptions similar thereto are omitted.

A copper wiring layer M51 is arranged in an interlayer insulation film D51 provided as an uppermost layer of the wiring structure 4A. A copper wiring layer M52 is arranged in an interlayer insulation film D52 provided as an uppermost layer of the wiring structure 4B.

The interlayer insulation film D51 and the interlayer insulation film D52 are directly bonded to each other through covalent bonding, and the wiring layer M51 and the wiring layer M52 are directly bonded to each other through metallic bonding. As described above, a bonding mode in which bonding of insulation bodies (e.g., interlayer insulation films D51 and D52) and bonding of conductive bodies (e.g., wiring layers M51 and M52) coexist in the bonding face 120 is called "hybrid bonding". A wiring pathway 411 included in the wiring structure 4A and a wiring pathway 412 included in the wiring structure 4B are bonded to each other at a bonding face 120 to constitute an electric pathway 41 which connects a thin film transistor 30 and a semiconductor element 10. Further, an electric pathway 40 for connecting a semiconductor element arranged in the semiconductor layer 1 and a semiconductor element arranged in the semiconductor layer 2 without an intervention of the thin film transistor 30 is also formed through the hybrid bonding. The above-described electric pathway 40 can be a power supply pathway between the semiconductor layer 1 and the semiconductor layer 2. By employing the above-described hybrid bonding, in comparison to the case where a through electrode 53 is used as described in the fifth exemplary embodiment, an electric connection point on a bonding face can be densified, and a utilized region of the semiconductor layer 1 can also be increased.

In each of the above-described various semiconductor devices 100, functions of the integrated circuits of the semiconductor layers 1 and 2 are not specified in particular. The integrated circuits may be the same types or different types. The type of integrated circuit may be a storage circuit (memory), an arithmetic circuit (processor), a control circuit (controller), a communication circuit, a power supply circuit, an input-output (I/O) circuit, a detection circuit (sensor), or a display circuit (display). Further, the semiconductor elements 10 and 20 mutually connected via the thin film transistor 30 may be included in analog circuits, or may be included in digital circuits. Alternatively, one of the semiconductor elements 10 and 20 may be included in an analog circuit whereas the other may be included a digital circuit. In a case where the thin film transistor 30 is arranged on the outside of the semiconductor chips 5 and 6 as described in the first and second exemplary embodiments, the semiconductor elements 10 and 20 connected via the thin film transistor 30 are typically arranged in the I/O circuits of the semiconductor chips 5 and 6.

Figure 7:
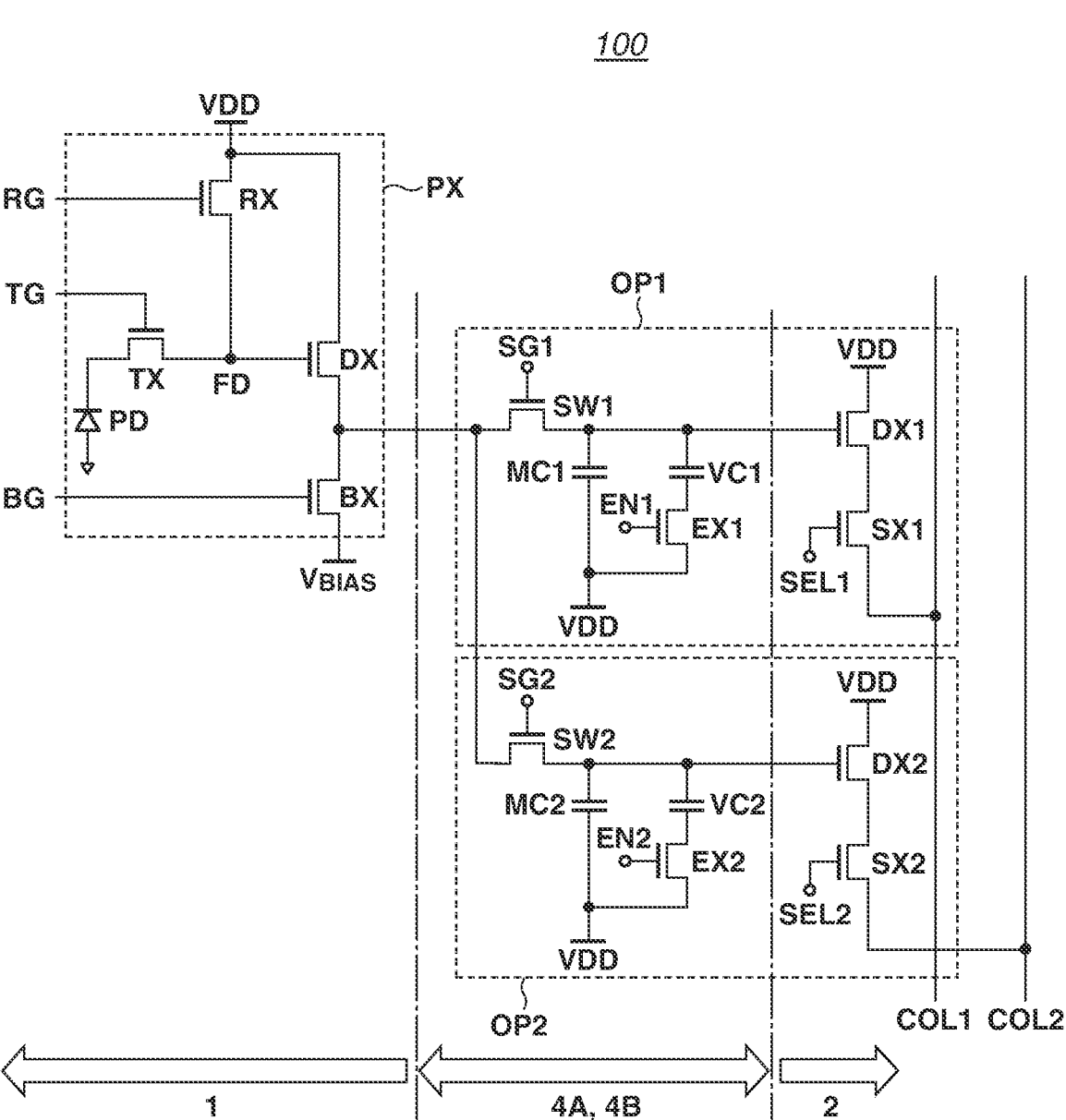
FIG. 7 is a schematic diagram illustrating a semiconductor device.

An example of the semiconductor device 100 applied to an image sensor is described with reference to FIG. 7. FIG. 7 is a schematic circuit diagram illustrating a circuit included in an image sensor. Details of the circuit diagram illustrated in FIG. 7 and a variation example thereof can be found in United States Patent Application Publication No. 2021/0400214, which is incorporated by reference herein in its entirety. The semiconductor device 100 includes a pixel circuit PX including a photodiode PD as an photoelectric conversion element, an output circuit OP1 connected to the pixel circuit PX, and an output circuit OP2 connected to the pixel circuit PX. The output circuits OP1 and OP2 may be connected to the pixel circuit PX in parallel.

The pixel circuit PX includes a photodiode PD, a floating diffusion node FD, a transfer element TX, a reset element RX, a driving element DX, and a bias element BX. The floating diffusion node FD may be a node in which electric charges generated in the photodiode PD are accumulated, and the transfer element TX may be connected between the floating diffusion node FD and the photodiode PD. When the transfer element TX is turned on by a transfer control signal TG, the electric charges generated in the photodiode PD are moved and accumulated in the floating diffusion node FD.

The reset element RX may be connected between a power supply node for supplying power-supply voltage VDD and the floating diffusion node FD. When the reset element RX is turned on by a reset control signal RG, the electric charges accumulated in the floating diffusion node FD are removed, and a voltage of the floating diffusion node FD is reset.

The driving element DX includes a gate electrode connected to the floating diffusion node FD, and can operate as a source follower amplifier. The driving element DX amplifies and outputs the voltage of the floating diffusion node FD. The output circuits OP1 and OP2 may be connected to the output terminal of the driving element DX. Further, the driving element DX is connected to the bias element BX for supplying bias voltage VBIAS, so that the driving element DX can receive current necessary for operation via the bias element BX. The bias element BX may be turned on during operation of the driving element DX by a bias control signal BG.

The output circuit OP1 may be connected between the pixel circuit PX and a column signal line COL1.

The output circuit OP1 includes a switching element SW1, a primary capacitor MC1, a secondary capacitor VC1, a selection element SX1, and an output driving element DX1. The secondary capacitor VC1 is connected to an enable element EX1 in series. The secondary capacitor VC1 and the enable element EX1 may be connected to the primary capacitor MC1 in parallel.

The primary capacitor MC1, the enable element EX1, and the secondary capacitor VC1 can provide a capacitor of the output circuit OP1. Only the primary capacitor MC1 may be connected to the switching element SW1 when the enable element EX1 is in an off state, and the primary capacitor MC1 and the secondary capacitor VC1 may be connected to the switching element SW1 together when the enable element EX1 is in an on state. Accordingly, a capacity of the capacitor is changed based on change of the on/off state of the enable element EX1.

The output driving element DX1 receives the power-supply voltage VDD, and a gate of the output driving element DX1 may be connected to the switching element SW1. Accordingly, the output driving element DX1 operates as a source follower amplifier based on the voltage accumulated in the primary capacitor MC1 (or the primary capacitor MC1 and the secondary capacitor VC1). The selection element SX1 connected between the column signal line COL1 and the output driving element DX1 is controlled by a selection signal SELL The output circuit OP2 may be connected between the pixel circuit PX and a column signal line COL2.

The output circuit OP2 includes a switching element SW2, a primary capacitor MC2, a secondary capacitor VC2, a selection element SX2, and an output driving element DX2. A configuration and operation of the output circuit OP2 are similar to those of the output circuit OP1. For example, a capacitor of the output circuit OP2 is provided by the primary capacitor MC2, the enable element EX2 and the secondary capacitor VC2, and a capacity of the capacitor is changed based on change of the on/off state of the enable element EX2.

For example, the output circuit OP1 samples the reset voltage output from the pixel circuit PX, and the output circuit OP2 samples the pixel voltage output from the pixel circuit PX. For example, before the transfer element TX is turned on after the floating diffusion node FD is reset, the switching element SW1 may be turned on to make the reset voltage ON.

The pixel circuit PX can be formed as an integrated circuit of the semiconductor layer 1. The output driving elements DX1 and DX2 and the selection elements SX1 and SX2 can be formed as an integrated circuit of the semiconductor layer 2. Then, the switching elements SW1 and SW2, and the enable elements EX1 and EX2 can be the thin film transistors 30. In this case, the semiconductor element 10 is provided as the driving element DX and the bias element BX. Further, the semiconductor element 20 is provided as the VDD terminal and the output driving elements DX1 and DX2. For example, as illustrated in FIGS. 6A and 6B, the thin film transistor 30 can be arranged in the wiring structure 4B as well as the wiring structure 4A. Further, the primary capacitors MC1 and MC2 and the secondary capacitors VC1 and VC2 can be arranged in the wiring structure 4A or 4B as metal-insulator-metal (MIM) capacitors. In this way, it is possible to improve the integration degree of the semiconductor layer 1 and the integration degree of the semiconductor layer 2.

The switching elements SW1 and SW2 and the enable elements EX1 and EX2 are connected to the capacitors such as the primary capacitors MC1 and MC2 and the secondary capacitors VC1 and VC2. In this case, an oxide semiconductor layer can be used as the semiconductor layer 3 of the thin film transistor 30 provided as the switching elements SW1 and SW2 and the enable elements EX1 and EX2. By using the oxide semiconductor layer, it is possible to reduce the leak current of the switching elements SW1 and SW2 and the enable elements EX1 and EX2. Therefore, it is possible to suppress fluctuation of the hold voltage of the capacitors such as the primary capacitors MC1 and MC2 and the secondary capacitors VC1 and VC2.

Figure 8:
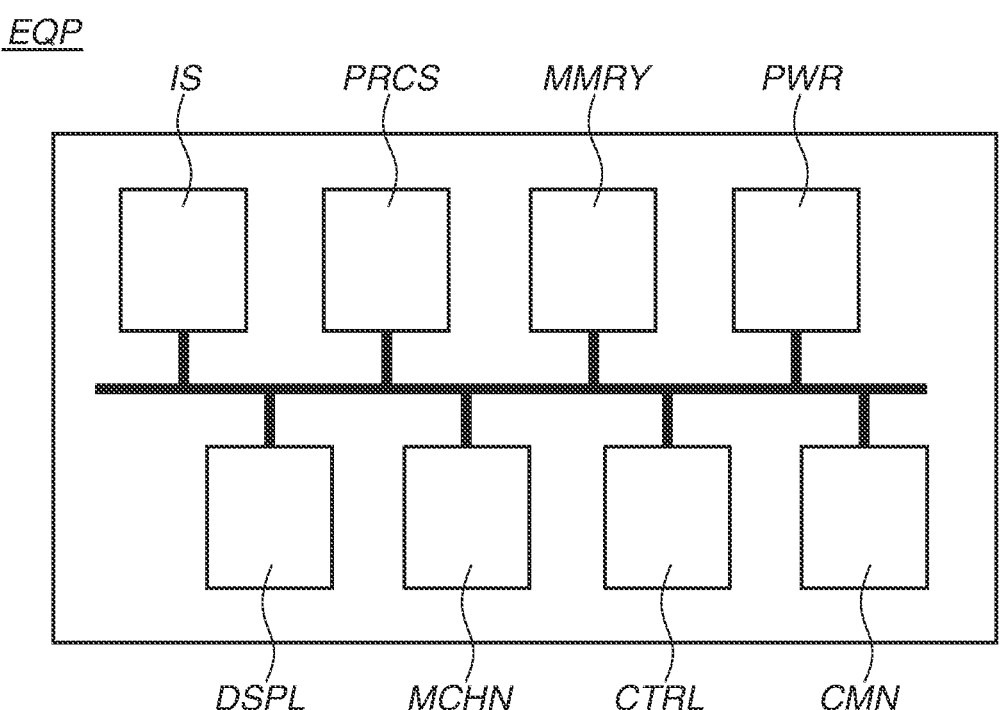
FIG. 8 is a schematic diagram illustrating equipment.

Various types of equipment which include the semiconductor device 100 according to the above-described exemplary embodiment also include a device other than the semiconductor device 100. A piece of equipment EQP including the semiconductor device 100 is described with reference to FIG. 8. The equipment EQP includes at least any one of an imaging device IS, a display device DSPL, a processing device PRCS, an electromechanical device MCHN, a control device CTRL, a storage device MMRY, a power supply device PWR, and a communication device CMN. The imaging device IS is a complementary metal-oxide semiconductor (CMOS) image sensor, a charge-coupled device (CCD) image sensor, or a single-photon avalanche diode (SPAD) sensor. The display device DSPL may include an organic electro-luminescence (EL) element and a liquid crystal element. The processing device (arithmetic device) PRCS is a central processing unit (CPU) or a graphic processor unit (GPU). The storage device MMRY may include a dynamic random access memory (DRAM) cell and a flash memory cell. The control device CTRL is a device such as an application specific integrated circuit (ASIC). The electromechanical device MCHN is a device such as a micro-electro mechanical system (MEMS) device. The communication device CMN is a communication device used for mobile communication and wireless communication. The power supply device PWR generates voltage to operate various devices, and controls a power saving function. There is a case where the thin film transistor 30 is operated by a driving voltage (gate voltage or source/drain voltage) higher than a driving voltage of the integrated circuits of the semiconductor layers 1 and 2. In this case, the power supply device PWR includes at least any one of a booster circuit for generating driving voltage of the thin film transistor 30 or a step-down circuit for generating driving voltage of the integrated circuits of the semiconductor layers 1 and 2.

At least any one of the imaging device IS, the display device DSPL, the processing device PRCS, the electromechanical device MCHN, the control device CTRL, the storage device MMRY, the power supply device PWR, and the communication device CMN included in the equipment EQP is the semiconductor device 100 according to the present exemplary embodiment. At least any one of the imaging device IS, the display device DSPL, the processing device PRCS, the electromechanical device MCHN, the control device CTRL, the storage device MMRY, the power supply device PWR, and the communication device CMN included in the equipment EQP is another device.

As described above, the equipment EQP which includes the semiconductor device 100 is not limited to imaging equipment, such as a camera. The equipment EQP may be electronic equipment, such as a smartphone or a personal computer, or display equipment, such as a television or a display. Further, the equipment EQP can be transportation equipment, such as a vehicle, a ship, or an air vehicle. Furthermore, the equipment EQP can be medical equipment, such as an endoscope or radiodiagnosis equipment; measurement equipment, such as a range-finding sensor; analytical equipment, such as an electronic microscope; office equipment, such as a printer, a scanner, or a copying machine; or industrial equipment, such as a robot or manufacturing equipment.

According to the present disclosure, it is possible to provide a technique advantageous to an improvement in performance of the semiconductor device.

The above-described exemplary embodiments can be modified or changed within a range which does not depart from the technical spirit of the present disclosure. For example, the plurality of exemplary embodiments can be combined as appropriate. Further, a part of the aspects of at least one exemplary embodiment can be deleted or replaced. Furthermore, an aspect can newly be added to at least one exemplary embodiment.

The content of disclosure of this specification includes not only the content explicitly described in this specification but also all the respects that can be grasped from this specification and drawings attached thereto. The content of disclosure of this specification includes a complement of the individual concept described in this specification. In other words, if this specification includes a description "A is B", for example, this can be said that the specification also discusses a case where "A is not B" even if a description of the case where "A is not B" is omitted. This is because "A is B" is described based on the premise that the case where "A is not B" is taken into consideration.

While the present disclosure has described exemplary embodiments, it is to be understood that some embodiments are not limited to the disclosed exemplary embodiments. The scope of the following claims is to be accorded the broadest interpretation so as to encompass all such modifications and equivalent structures and functions.

This application claims priority to Japanese Patent Application No. 2022-106005, which was filed on Jun. 30, 2022 and which is hereby incorporated by reference herein in its entirety.

What is claimed is:

1. A semiconductor device comprising:
   a first monocrystalline semiconductor layer on which a first semiconductor element is arranged;
   a second monocrystalline semiconductor layer on which a second semiconductor element is arranged; and
   a thin film transistor electrically connected to the first semiconductor element without intervention of another semiconductor element arranged on the first monocrystalline semiconductor layer, and electrically connected to the second semiconductor element without intervention of another semiconductor element arranged on the second monocrystalline semiconductor layer,
   wherein the thin film transistor includes an oxide semiconductor layer.

2. The semiconductor device according to claim 1, wherein the thin film transistor includes at least one of the following: a non-crystalline semiconductor layer, and a polycrystalline semiconductor layer.

3. The semiconductor device according to claim 2, wherein the thin film transistor is arranged between the first monocrystalline semiconductor layer and the second monocrystalline semiconductor layer.

4. The semiconductor device according to claim 1, wherein the first monocrystalline semiconductor layer and the second monocrystalline semiconductor layer are stacked on each other.

5. The semiconductor device according to claim 1, wherein the thin film transistor is connected to power supply wiring.

6. The semiconductor device according to claim 1, wherein the thin film transistor is connected to a capacitor.

7. The semiconductor device according to claim 1, further comprising:
   a first wiring structure arranged on an upper side of the first monocrystalline semiconductor layer; and
   a second wiring structure arranged on an upper side of the second monocrystalline semiconductor layer,
   wherein the first wiring structure and the second wiring structure are bonded by hybrid bonding, and
   wherein the thin film transistor is arranged in the second wiring structure.

8. The semiconductor device according to claim 1, wherein the first semiconductor element is a metal-oxide semiconductor field-effect transistor (MOSFET).

9. The semiconductor device according to claim 1, wherein the first semiconductor element is a diode or a transistor.

10. The semiconductor device according to claim 9, wherein the second semiconductor element is a diode or a transistor.

11. The semiconductor device according to claim 10, wherein the second semiconductor element is a MOSFET.

12. The semiconductor device according to claim 1, wherein a material of the oxide semiconductor layer is indium gallium oxide (In—Ga—O), indium gallium zinc oxide (In—Ga—Zn—O), indium tin zinc oxide (In—Sn—Zn——), or indium gallium zinc tin oxide (In—Ga—Zn—Sn—O).

13. A semiconductor device comprising:
a first monocrystalline semiconductor layer on which a first semiconductor element is arranged;
a second monocrystalline semiconductor layer on which a second semiconductor element is arranged; and
a thin film transistor electrically connected to the first semiconductor element without intervention of another semiconductor element arranged on the first monocrystalline semiconductor layer, and electrically connected to the second semiconductor element without intervention of another semiconductor element arranged on the second monocrystalline semiconductor layer,
wherein a current pathway continues from the thin film transistor to the first semiconductor element, and a current pathway continues from the thin film transistor to the second semiconductor element.

14. The semiconductor device according to claim 13, wherein the thin film transistor includes an oxide semiconductor layer.

15. A semiconductor device comprising:
a circuit board including a substrate and a wiring structure arranged on an upper side of the substrate;
a first semiconductor chip including a first monocrystalline semiconductor layer on which a first semiconductor element is arranged, the first semiconductor chip being arranged on an upper side of the circuit board; and
a second semiconductor chip including a second monocrystalline semiconductor layer on which a second semiconductor element is arranged, the semiconductor chip being arranged on the upper side of the circuit board,
wherein the circuit board includes a thin film transistor arranged on the upper side of the substrate, and
wherein the thin film transistor is electrically connected to the first semiconductor element without intervention of another semiconductor element arranged on the first monocrystalline semiconductor layer, and electrically connected to the second semiconductor element without intervention of another semiconductor element arranged on the second monocrystalline semiconductor layer.

16. The semiconductor device according to claim 15, wherein the circuit board is arranged between the first semiconductor chip and the second semiconductor chip.

17. The semiconductor device according to claim 15, wherein the thin film transistor includes an oxide semiconductor layer.

18. Equipment comprising:
the semiconductor device according to claim 13; and at least one of an imaging device, a display device, a processing device, an electromechanical device, a control device, a storage device, a power supply device, or a communication device.

19. Equipment comprising:
a first monocrystalline semiconductor layer on which a first semiconductor element is arranged;
a second monocrystalline semiconductor layer on which a second semiconductor element is arranged;
a thin film transistor electrically connected to the first semiconductor element without intervention of another semiconductor element arranged on the first monocrystalline semiconductor layer, and electrically connected to the second semiconductor element without intervention of another semiconductor element arranged on the second monocrystalline semiconductor layer, wherein the thin film transistor includes an oxide semiconductor layer; and
at least one of an imaging device, a display device, a processing device, an electromechanical device, a control device, a storage device, a power supply device, or a communication device.

20. A semiconductor device comprising:
a monocrystalline semiconductor layer on which a semiconductor element is arranged;
a wiring structure connected to the semiconductor element, the wiring structure being arranged on a first side of the monocrystalline semiconductor layer;
a through electrode penetrating through the monocrystalline semiconductor layer; and
a thin film transistor arranged on a second side of the monocrystalline semiconductor layer, the second side being opposite to the first side on which the wiring structure is arranged,
wherein the semiconductor element and the thin film transistor are electrically connected via the wiring structure and the through electrode.

21. The semiconductor device according to claim 20, wherein the semiconductor element is a MOSFET.

22. The semiconductor device according to claim 21, wherein the semiconductor element is a fin field-effect transistor (FinFET).

23. The semiconductor device according to claim 20, wherein the thin film transistor is connected to power supply wiring.

24. The semiconductor device according to claim 20, wherein the thin film transistor includes an oxide semiconductor layer.

25. Equipment comprising:
a monocrystalline semiconductor layer on which a semiconductor element is arranged;
a wiring structure connected to the semiconductor element, the wiring structure being arranged on a first side of the monocrystalline semiconductor layer;
a through electrode penetrating through the monocrystalline semiconductor layer;
a thin film transistor arranged on a second side of the monocrystalline semiconductor layer, the second side being opposite to the first side on which the wiring structure is arranged, wherein the semiconductor element and the thin film transistor are electrically connected via the wiring structure and the through electrode; and
at least one of an imaging device, a display device, a processing device, an electromechanical device, a control device, a storage device, a power supply device, or a communication device.

* * * * *